(12) United States Patent
Ishigami et al.

(10) Patent No.: US 11,509,248 B2
(45) Date of Patent: Nov. 22, 2022

(54) POSITION ESTIMATION DEVICE AND POSITION ESTIMATION METHOD

(71) Applicant: Nidec Corporation, Kyoto (JP)

(72) Inventors: Shota Ishigami, Kyoto (JP); Atsushi Fujita, Kyoto (JP); Tomohisa Tokunaga, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 17/289,314

(22) PCT Filed: Oct. 24, 2019

(86) PCT No.: PCT/JP2019/041597
§ 371 (c)(1),
(2) Date: Apr. 28, 2021

(87) PCT Pub. No.: WO2020/090595
PCT Pub. Date: May 7, 2020

(65) Prior Publication Data
US 2022/0014129 A1     Jan. 13, 2022

(30) Foreign Application Priority Data
Oct. 29, 2018   (JP) .............................. JP2018-203232

(51) Int. Cl.
*B82Y 25/00*    (2011.01)
*H02P 6/18*     (2016.01)
*G01R 33/10*    (2006.01)

(52) U.S. Cl.
CPC ................ *H02P 6/18* (2013.01); *G01R 33/10* (2013.01)

(58) Field of Classification Search
CPC .. G01D 5/145; H02P 6/16; H02P 6/18; G01R 33/10
See application file for complete search history.

(56) References Cited

U.S. PATENT DOCUMENTS

2015/0303846 A1* 10/2015 Tatebe .................. H02P 6/16
                                                  318/400.06
2017/0343382 A1* 11/2017 Fukumura ............. G01D 5/145

FOREIGN PATENT DOCUMENTS

CN    107148741 A     9/2017
EP    3 240 182 A1   11/2017
(Continued)

OTHER PUBLICATIONS

Official Communication issued in International Patent Application No. PCT/JP2019/041597, dated Dec. 10, 2019.

*Primary Examiner* — Cortez M Cook
(74) *Attorney, Agent, or Firm* — Keating & Bennett

(57) ABSTRACT

A position estimation device acquires detection values of magnetic field strength at three or more locations of a rotor in a range where a rotor angle is less than one rotation. A section is selected based on a detection value of the magnetic field strength from predetermined sections for a pole pair number of the rotor. A feature amount calculator is provided to calculate feature amounts of a waveform of the magnetic field strength based on a combination of the detection values of the magnetic field strength according to the section selected. An estimator is provided to determine, for each segment associated with the section selected, whether or not a magnitude relationship of the feature amounts learned in advance coincides with a magnitude relationship of the feature amounts calculated, and estimating, as a rotation position of the rotor, the pole pair number associated with the segment having the same magnitude relationship.

6 Claims, 14 Drawing Sheets

(56) References Cited

FOREIGN PATENT DOCUMENTS

| | | | |
|---|---|---|---|
| JP | 2015-211593 A | 11/2015 | |
| JP | 2017-143612 A | 8/2017 | |
| JP | 6233532 B2 | 11/2017 | |
| KR | 10-2017-0090463 A | 8/2017 | |
| WO | WO-2008148698 A1 * | 12/2008 | ............ B82Y 25/00 |
| WO | 2016/104378 A1 | 6/2016 | |

* cited by examiner

| POLE PAIR NUMBER | 0 | | | 1 | | | 2 | | | 3 | | |
|---|---|---|---|---|---|---|---|---|---|---|---|---|
| SECTION | 0 | ... | 11 | 0 | ... | 11 | 0 | ... | 11 | 0 | ... | 11 |
| SEGMENT | 0 | ... | 11 | 12 | ... | 23 | 24 | ... | 35 | 36 | ... | 47 |

FIG. 2

| POLE PAIR NUMBER | max | min |
|---|---|---|
| 0 | 7689 | 7362 |
| 1 | 7940 | 7672 |
| 2 | 7304 | 7709 |
| 3 | 7070 | 7417 |

FIG. 11

| POLE PAIR NUMBER | FIRST INTERSECTION POINT | SECOND INTERSECTION POINT | THIRD INTERSECTION POINT |
|---|---|---|---|
| 0 | 3889 | 3793 | 3867 |
| 1 | 4140 | 3674 | 3882 |
| 2 | 3615 | 3806 | 3766 |
| 3 | 3370 | 3907 | 3767 |

FIG. 12

POSITION ESTIMATION DEVICE AND POSITION ESTIMATION METHOD

CROSS REFERENCE TO RELATED APPLICATIONS

This is a U.S. national stage of PCT Application No. PCT/JP2019/041597, filed on Oct. 24, 2019, with priority under 35 U.S.C. § 119(a) and 35 U.S.C. § 365(b) being claimed from Japanese Application No. 2018-203232, filed Oct. 29, 2018, the entire disclosures of which are hereby incorporated herein by reference.

1. FIELD OF THE INVENTION

The present invention relates to a position estimation device and a position estimation method.

2. BACKGROUND

Conventionally, a method of estimating the rotation position of the rotor of a motor using a position sensor such as an optical encoder has been known, but a method of estimating the rotation position of the rotor of a motor without using a position sensor has been required for the purpose of miniaturization and cost reduction of the motor. Japanese Patent Publication No. 6233532 discloses a method of estimating the rotation position of the rotor of a motor without using a position sensor.

However, when the rotation position of the rotor is estimated without using a position sensor, there have been cases where the rotation position of the rotor cannot be estimated in a range where the rotor angle is less than one rotation.

SUMMARY

In view of the above circumstances, example embodiments of the present invention provide position estimation devices and position estimation methods each capable of estimating the rotation position of a rotor even if the rotor angle is less than one rotation.

One example embodiment of the present disclosure acquires detection values of a magnetic field strength at three or more locations of a rotor in a range where the rotor angle is less than one rotation. From a plurality of sections predetermined for the pole pair number of the rotor, the section is selected based on the detection value of the magnetic field strength. A feature amount calculator is provided to calculate a plurality of feature amounts of a waveform of the magnetic field strength based on a combination of detection values of the magnetic field strength according to the selected section. A position estimation device includes an estimator to determine, for each segment associated with the section selected, whether or not a magnitude relationship of the plurality of feature amounts learned in advance coincides with a magnitude relationship of the plurality of feature amounts calculated, and to estimate, as a rotation position of the rotor, the pole pair number associated with the segment with which the magnitude relationship coincides.

One example embodiment of the present disclosure is a position estimation method executed by a position estimation device to acquire detection values of a magnetic field strength at three or more places of the rotor in a range where the rotor angle is less than one rotation, and to select the section based on the detection value of the magnetic field strength from a plurality of sections predetermined for the pole pair number of the rotor. One example embodiment of the present disclosure is a position estimation method including calculating a plurality of feature amounts of a waveform of the magnetic field strength based on a combination of detection values of the magnetic field strength corresponding to the section selected, and determining, for each segment associated with the section selected, whether or not the magnitude relationship of the plurality of feature amounts learned in advance coincides with the magnitude relationship of the plurality of feature amounts calculated, and estimating, as a rotation position of the rotor, the pole pair number associated with the segment having the same magnitude relationship.

According to an example embodiment of the present disclosure, the rotation position of a rotor can be estimated even if the rotor angle is less than one rotation.

The above and other elements, features, steps, characteristics and advantages of the present disclosure will become more apparent from the following detailed description of the example embodiments with reference to the attached drawings.

BRIEF DESCRIPTION OF THE DRAWINGS

FIG. 2 is a view showing an example of a correspondence relationship between a pole pair number, a section, and a segment in the first example embodiment.

FIG. 11 is a view showing an example of a learning value of a maximum value and a minimum value of a waveform in the second example embodiment.

FIG. 12 is a view showing an example of a learning value of an intersection point of a waveform in the second example embodiment.

DETAILED DESCRIPTION

Example embodiments of the present disclosure will be described in detail with reference to the drawings.

The First Example Embodiment

Figure 1:
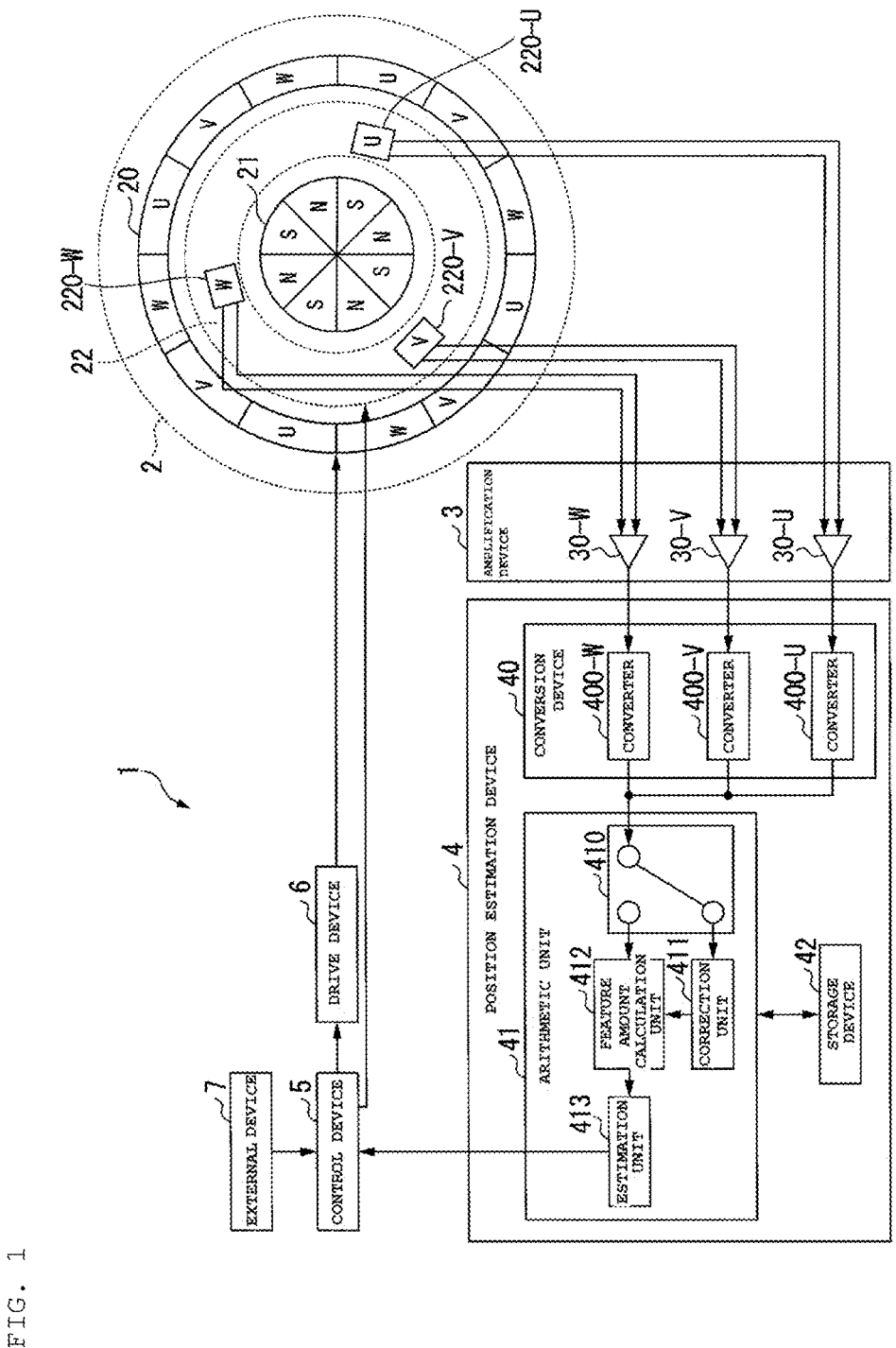
FIG. 1 is a view showing an example of a configuration of a motor assembly in a first example embodiment of the present disclosure.

FIG. 1 is a view showing an example of the configuration of a motor assembly 1. The motor assembly 1 is a system that estimates the rotation position of a rotor of a motor. The motor assembly 1 includes a motor 2, an amplification device 3, a position estimation device 4, a control device 5, and a drive device 6.

The motor 2 is an electric motor, for example, a brushless motor or a stepping motor. The motor 2 may be an inner rotor type motor or an outer rotor type motor. The motor 2 shown in FIG. 1 is, for example, an inner rotor type motor. The motor 2 includes a stator 20, a rotor 21, and a detection device 22.

The stator 20 includes a winding of plurality of slots of U-phase, V-phase, and W-phase. In FIG. 1, the stator 20 includes windings of a total of 12 slots, which are, a 4-slot U-phase winding, a 4-slot V-phase winding, and a 4-slot W-phase winding. A three-phase current whose phase is shifted by 120 degrees is input to the stator 20 from the drive device 6. The stator 20 generates a magnetic field at the positions of the rotor 21 and the detection device 22 by a three-phase current input to each winding of the U-phase, V-phase, and W-phase.

The rotor 21 rotates about the central axis by receiving the magnetic force of the stator 20. The rotor 21 includes one or more magnetic pole pairs (N pole and S pole). In FIG. 2, the rotor 21 includes, as an example, four sets of magnetic pole pairs. The rotor 21 rotates when the magnetic pole pair receives the magnetic force from the stator 20. A pole pair number is assigned to the magnetic pole pair. A section and a segment are associated with the pole pair number.

FIG. 2 is a view showing an example of the correspondence relationship between a pole pair number, a section, and a segment. A section number group is associated with the pole pair number. The number of section numbers is equal to the number of 12 logics including the magnitude relationship of output signals of three sensors 220 of the detection device 22 and the positive and negative (zero cross) of an intermediate signal. In FIG. 2, the pole pair number "0" is associated with section numbers from "0" to "11". The segment number is a unique number representing the absolute value of the mechanical angle of the rotor 21. For example, the section numbers "0" to "11" of the pole pair number "0" are associated with the segment numbers "0" to "11". For example, the section numbers "0" to "11" of the pole pair number "1" are associated with the segment numbers "12" to "23". A data table presenting the correspondence relationship shown in FIG. 2 is stored in advance in a storage device 42, for example.

The detection device 22 is a device that detects the magnetic field strength. The detection device 22 detects the magnetic field strength at three or more places in the vicinity of the rotor 21. The detection device 22 includes three or more magnetic field sensors. In FIG. 1, the detection device 22 includes a sensor 220-U, a sensor 220-V, and a sensor 220-W. The magnetic field sensor is, for example, a Hall element, a linear Hall integrated circuit (IC), or a magnetoresistive sensor. In the present example embodiment, a description will be made on an assumption that the magnetic field sensor is a Hall element.

The sensor 220-U is a sensor that detects the magnetic field strength of the U-phase. The sensor 220-U outputs, to the amplification device 3, a U-phase differential signal, which is a differential signal representing the magnetic field strength of the U-phase. The sensor 220-V is a sensor that detects the magnetic field strength of the V-phase. The sensor 220-V outputs, to the amplification device 3, a V-phase differential signal, which is a differential signal representing the magnetic field strength of the V-phase. The sensor 220-W is a sensor that detects the magnetic field strength of the W-phase. The sensor 220-W outputs, to the amplification device 3, a W-phase differential signal, which is a differential signal representing the magnetic field strength of the W-phase.

The amplification device 3 is a device that amplifies the amplitude of the waveform of a differential signal. The amplification device 3 includes a differential amplifier 30-U, a differential amplifier 30-V, and a differential amplifier 30-W. The differential amplifier 30-U generates an analog U-phase signal Hu by performing amplification processing on the U-phase differential signal. The differential amplifier 30-V generates an analog V-phase signal Hv by performing amplification processing on the V-phase differential signal. The differential amplifier 30-W generates an analog W-phase signal Hw by performing amplification processing on the W-phase differential signal.

The position estimation device 4 is an information processing device that estimates the rotation position of the rotor of the motor. The position estimation device 4 acquires an analog U-phase signal Hu, an analog V-phase signal Hu, and an analog W-phase signal Hv from the amplification device 3. The position estimation device 4 calculates a plurality of feature amounts of each waveform of the U-phase signal Hu, the V-phase signal Hv, and the W-phase signal Hw. The position estimation device 4 estimates the rotation position of the rotor 21 of the motor 2 based on the plurality of feature amounts of the calculated waveforms. The position estimation device 4 outputs the estimation result (pole pair number) of the rotation position to the control device 5.

The control device 5 is an information processing device that generates a control signal. The control device 5 generates a control signal based on an instruction signal. The control signal is, for example, a signal representing a register value corresponding to an instructed rotation direction (CW: clockwise, CCW: counterclockwise) and a signal representing a current value of a current output from the drive device 6 to the stator 20. The control signal may be, for example, a current signal supplied to the power supply of the detection device 22 of the motor 2. The control device 5 can control the power supply of each of the sensors 220 by controlling the current amount supplied to the power supply of the detection device 22.

The drive device 6 is a device that drives the rotor of the motor. A control signal is input to the drive device 6 from the control device 5. The drive device 6 inputs a three-phase current of a current value represented by a control signal to each winding of the stator 20. The drive device 6 can rotate the rotor 21 by inputting a three-phase current to each winding of the stator 20. Although the details will be described later, in the first example embodiment, the position estimation of the rotor 21 is performed in a state where the drive device 6 does not input a three-phase current to each winding of the stator 20. That is, in the first example embodiment, the position estimation device 4 estimates the rotation position of the stopped rotor 21. The position estimation device 4 may estimate the rotation position of the rotating rotor 21.

An external device 7 is an information processing device that generates an instruction signal such as the rotation direction and rotation speed of the rotor. The external device 7 outputs an instruction signal to the control device 5.

Next, the details of the configuration example of the position estimation device 4 will be described. The position estimation device 4 includes a conversion device 40, an arithmetic unit 41, and a storage device 42. The conversion device 40 converts an analog signal into a digital signal. The conversion device 40 includes a converter 400-U, a converter 400-V, and a converter 400-W.

The converter 400 is a device that converts an analog signal into a digital signal. The converter 400-U converts an analog U-phase signal acquired from the differential amplifier 30-U into a digital U-phase signal. The converter 400-V converts an analog U-phase signal acquired from the differential amplifier 30-V into a digital V-phase signal. The converter 400-W converts an analog W-phase signal acquired from the differential amplifier 30-W into a digital V-phase signal.

The arithmetic unit 41 is a device that executes arithmetic processing. A part or entirety of the arithmetic unit 41 is implemented by a processor such as a central processing unit (CPU) executing a program expanded in a memory. A part or entirety of the arithmetic unit 41 may be implemented using hardware such as a large scale integration (LSI) or an application specific integrated circuit (ASIC).

The arithmetic unit 41 includes a switch unit 410, a corrector 411, a feature amount calculator 412, and an estimator 413. Since the corrector 411 is provided for the purpose of improving the accuracy of position estimation, the corrector 411 is not an essential component.

The switch unit 410 connects any one of the feature amount calculator 412 and the corrector 411 to the conversion device 40. When the estimator 413 estimates the rotation position of the rotor 21 based on a waveform having not been corrected, the switch unit 410 outputs the U-phase signal Hu, the V-phase signal Hv, and the W-phase signal Hw acquired from the conversion device 40 to the feature amount calculator 412.

When the estimator 413 estimates the rotation position of the rotor 21 based on a waveform having not been corrected (hereinafter referred to as a "corrected waveform"), the switch unit 410 outputs the U-phase signal Hu, the V-phase signal Hv, and the W-phase signal Hw acquired from the conversion device 40 to the corrector 411. The corrector 411 corrects the waveforms of each magnetic field strength of the U-phase signal Hu, the V-phase signal Hv, and the W-phase signal Hw. Thus, the corrector 411 can improve the accuracy of the estimation of the rotation position of the rotor 21 by the estimator 413, as compared with the accuracy of the estimation of the rotation position of the rotor 21 by the estimator 413 based on an uncorrected waveform.

The feature amount calculator 412 acquires detection values of magnetic field strength at three or more places of the rotor 21. When the estimator 413 estimates the rotation position of the rotor 21 based on a waveform having not been corrected, the feature amount calculator 412 acquires the waveforms of each magnetic field strength of the U-phase signal Hu, the V-phase signal Hv, and the W-phase signal Hw from the switch unit 410. When the estimator 413 estimates the rotation position of the rotor 21 based on a corrected waveform, the feature amount calculator 412 acquires the corrected waveforms of each magnetic field strength of the U-phase signal Hu, the V-phase signal Hv, and the W-phase signal Hw from the corrector 411.

The estimator 413 determines, for each segment associated with the selected section, whether or not the magnitude relationship of the plurality of feature amounts (each learning value) learned in advance coincides with the magnitude relationship of the plurality of feature amounts (each estimation value) calculated. The estimator 413 outputs the estimation result (pole pair number) of the rotation position to the control device 5.

The storage device 42 is preferably a nonvolatile recording medium (non-temporary recording medium) such as a flash memory and a hard disk drive (HDD). The storage device 42 may include a volatile recording medium such as a random access memory (RAM). The storage device 42 stores a program and a data table such as learning values.

Next, the learning operation will be described.

Figure 3:
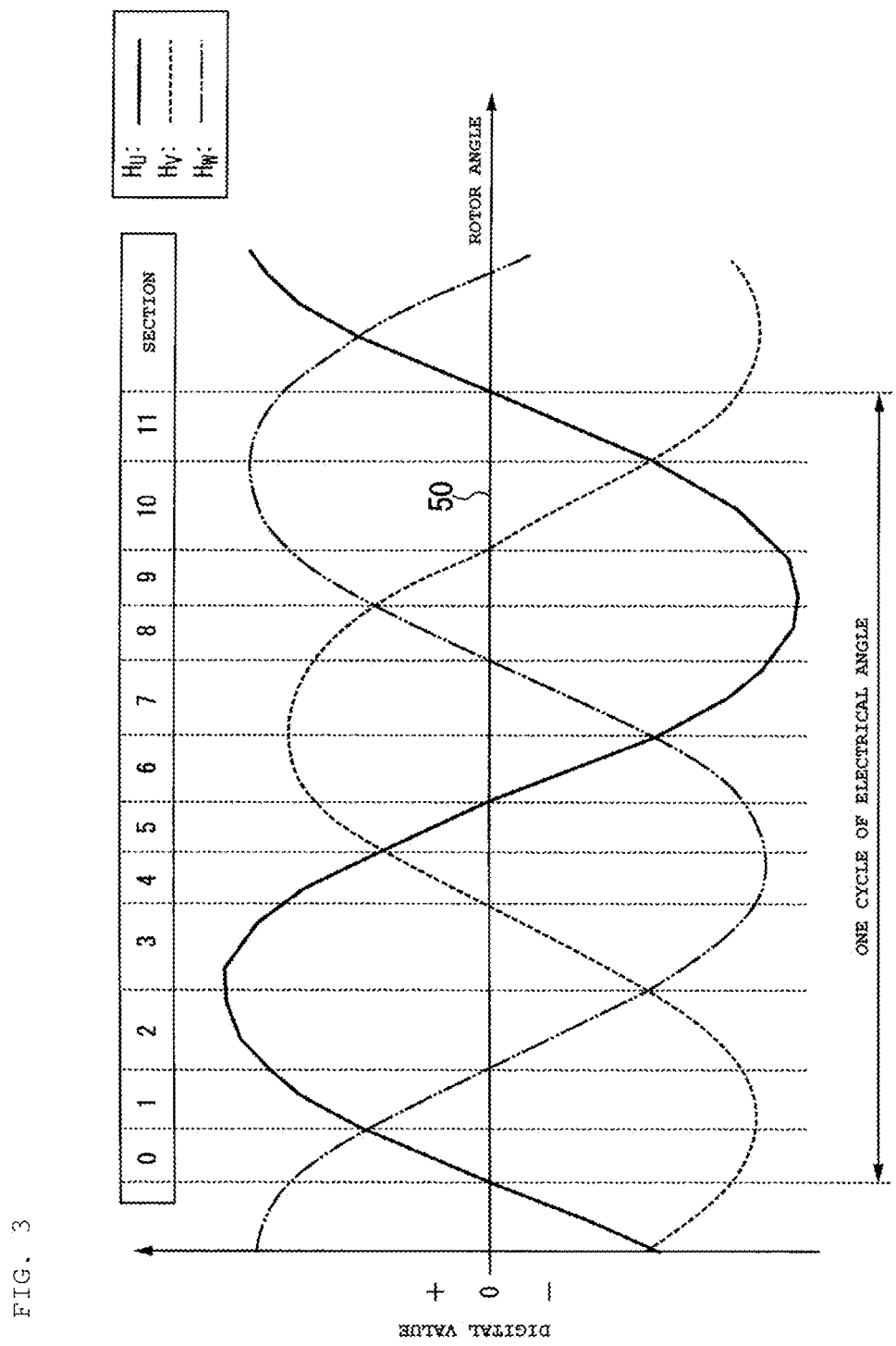
FIG. 3 is a view showing an example of a learning value of a waveform of a magnetic field strength in the first example embodiment.

FIG. 3 is a view showing an example of the learning value of a waveform of a magnetic field strength. The learning value of the waveform of the magnetic field strength is generated in advance. The pre-generation processing of the learning value of the waveform is performed prior to shipment of the motor assembly 1, for example. The pre-generation processing of the learning value of the waveform is performed, for example, by rotating the rotor 21 at a constant speed with an external position sensor connected to the rotor 21, and detecting the waveform output from the detection device 22.

The waveform shown in FIG. 3 is a corrected waveform of the magnetic field strength corresponding to the rotor angle of the rotor 21 in the case where the rotor 21 is rotating in the pre-generation processing of the learning value of the waveform. A data table presenting the correspondence relationship between a learning value and a section of a feature point (intersection point) in the waveform of each magnetic field strength is stored in advance in the storage device 42, for example.

FIG. 3 shows correspondence relationships between each of the learning value of the waveform of the U-phase signal Hu, the learning value of the waveform of the V-phase signal Hv, and the learning value of the waveform of the W-phase signal Hw, and a section, as an example of a correspondence relationship between the learning value of the waveform of each magnetic field strength and the section. The digital value of the amplitude which is a positive value represents, for example, the digital value of the magnetic field strength of the N pole. The digital value of the amplitude which is a negative value represents, for example, the digital value of the magnetic field strength of the S pole.

Figure 4:
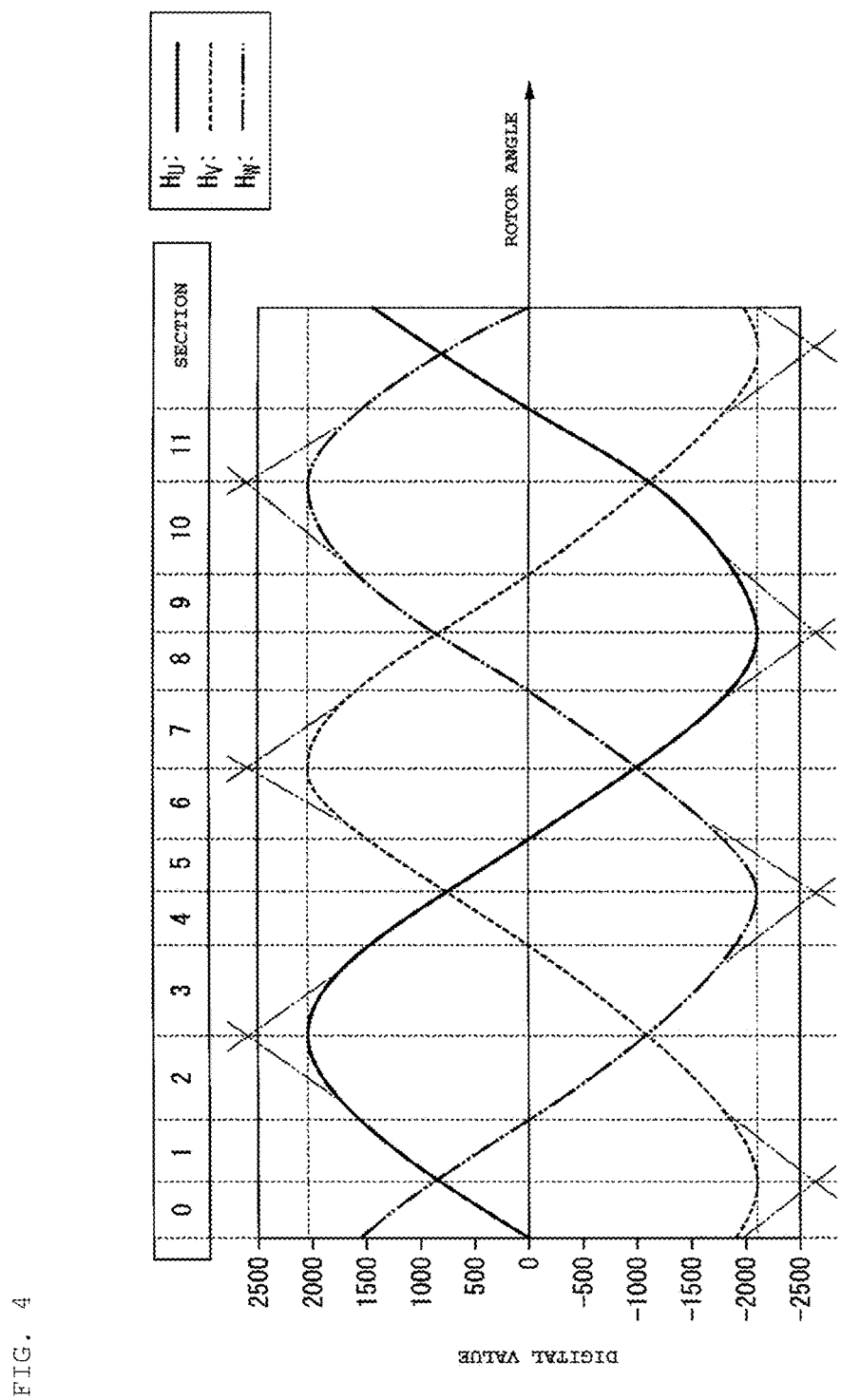
FIG. 4 is a view showing an example of a learning value of a corrected waveform in the first example embodiment.

FIG. 4 is a view showing an example of the learning value of a corrected waveform. The learning value of the corrected waveform of the magnetic field strength is generated before the estimator 413 executes position estimation. The corrected waveform shown in FIG. 4 is a corrected waveform of the magnetic field strength corresponding to the rotor angle of the rotor 21 in the case where the rotor 21 is rotating in the pre-generation processing of the learning value of the corrected waveform. A data table presenting the correspondence relationship the learning value and the section of the feature point (intersection point) in the corrected waveform of each magnetic field strength is stored in advance in a storage device 42, for example. In FIG. 4, the waveform of each magnetic field strength is corrected (triangular wave). Since the rotor 21 has a magnetic pole of 4-pole pair, by using an appropriate correction coefficient from among four correction coefficients, the vicinity of the maximum value and the minimum value of the waveform of each magnetic field strength is sharpened so that the vicinity of the maximum value and the minimum value of the waveform does not become flat.

FIG. 4 shows correspondence relationships between each of the learning value of the corrected waveform of the U-phase signal Hu, the learning value of the corrected waveform of the V-phase signal Hv, and the learning value of the corrected waveform of the W-phase signal Hw, and a section, as an example of a correspondence relationship between the learning value of the corrected waveform of each magnetic field strength and the section. The digital value of the amplitude which is a positive value represents, for example, the digital value of the magnetic field strength of the N pole. The digital value of the amplitude which is a negative value represents, for example, the digital value of the magnetic field strength of the S pole.

When the estimator 413 estimates the rotation position of the rotor 21 based on the corrected waveform, the corrector 411 makes the waveform of each magnetic field strength a corrected waveform (triangular wave). That is, the corrector 411 sharpens the vicinity of the maximum value and the minimum value of the waveform by using an appropriate correction coefficient from among the four correction coefficients because the rotor 21 has a magnetic pole of 4-pole pair so that the vicinity of the maximum value and the minimum value of the waveform of each magnetic field strength does not become flat. The corrector 411 generates a corrected waveform of each magnetic field strength of the same amplitude. These corrections improve the discriminability of each feature point of the corrected waveform.

The corrector 411 may perform at least one of the correction procedure and the temperature compensation procedure described in, for example, any of Japanese Patent Application Laid-Open No. 2018-029469, Japanese Patent Application Laid-Open No. 2018-029470, and Japanese Patent Application Laid-Open No. 2018-029471.

Next, an operation example of the position estimation device 4 will be described.

Figure 5:
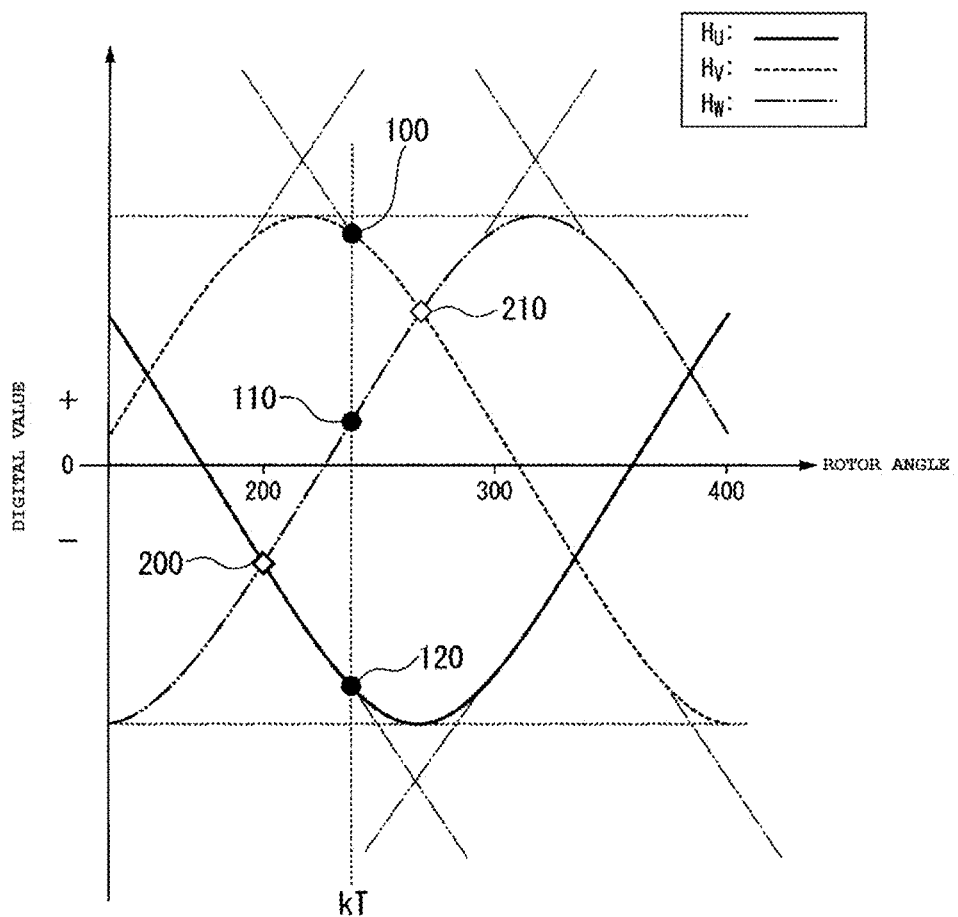
FIG. 5 is a view showing an example of a feature point of the corrected waveform in the first example embodiment.

FIG. 5 is a view showing an example of the feature point of the corrected waveform. In FIG. 5, the detection device 22 is energized while the rotation of the rotor 21 is stopped. The reference numeral "kT" shown in FIG. 5 represents the rotor angle (rotation position) of the rotor 21 at the time when the detection value in the corrected waveform is sampled by the feature amount calculator 412. The feature amount calculator 412 receives the detection value of a sample point 100 of the corrected waveform of the V-phase signal Hv. The feature amount calculator 412 receives the detection value of a sample point 110 of the corrected waveform of the W-phase signal Hw. The feature amount calculator 412 receives the detection value of a sample point 120 of the corrected waveform of the U-phase signal Hu.

The feature amount calculator 412 selects a section based on the detection value of each magnetic field strength of the U-phase signal Hu, the V-phase signal Hv, and the W-phase signal Hw from among a plurality of sections predetermined for the pole pair number shown in FIG. 2. In FIG. 5, the feature amount calculator 412 selects the section number "8" based on the magnitude relationships among the detection value of the sample point 100, the detection value of the sample point 110, and the detection value of the sample point 120, and the positive/negative of the sample point 110.

The feature amount calculator 412 calculates a plurality of feature amounts of the waveform or the corrected waveform of the magnetic field strength based on the combination of the detection values of the magnetic field strength corresponding to the selected section. The plurality of feature amounts are estimation values of each intersection point of the waveform or the corrected waveform of the magnetic field strength, for example.

The feature amount calculator 412 calculates the feature amount of the waveform or the corrected waveform of the magnetic field strength based on the combination of the sample point having the largest detection value and the sample point having the second largest detection value. In FIG. 5, the feature amount calculator 412 combines the sample point 100 and the sample point 110 based on the magnitude relationship of the detection value of the corrected waveform in the section number Based on the combination of the sample point 100 and the sample point 110, the feature amount calculator 412 calculates an estimation value of a feature point 210 of the V-phase signal Hv and the W-phase signal Hw. The estimation value of the feature point 210 is the mean value of the detection value of the sample point 100 and the detection value of the sample point 110.

The feature amount calculator 412 calculates the feature amount of the waveform or the corrected waveform of the magnetic field strength based on the combination of the sample point having the second largest detection value and the sample point having the third largest detection value. In FIG. 5, the feature amount calculator 412 combines the sample point 110 and the sample point 120 based on the magnitude relationship of the detection value of the corrected waveform in the section number "8". Based on the combination of the sample point 110 and the sample point 120, the feature amount calculator 412 calculates an estimation value of a feature point 200 of the U-phase signal Hu and the W-phase signal Hw. The estimation value of the feature point 200 is the mean value of the detection value of the sample point 110 and the detection value of the sample point 120.

Figure 6:
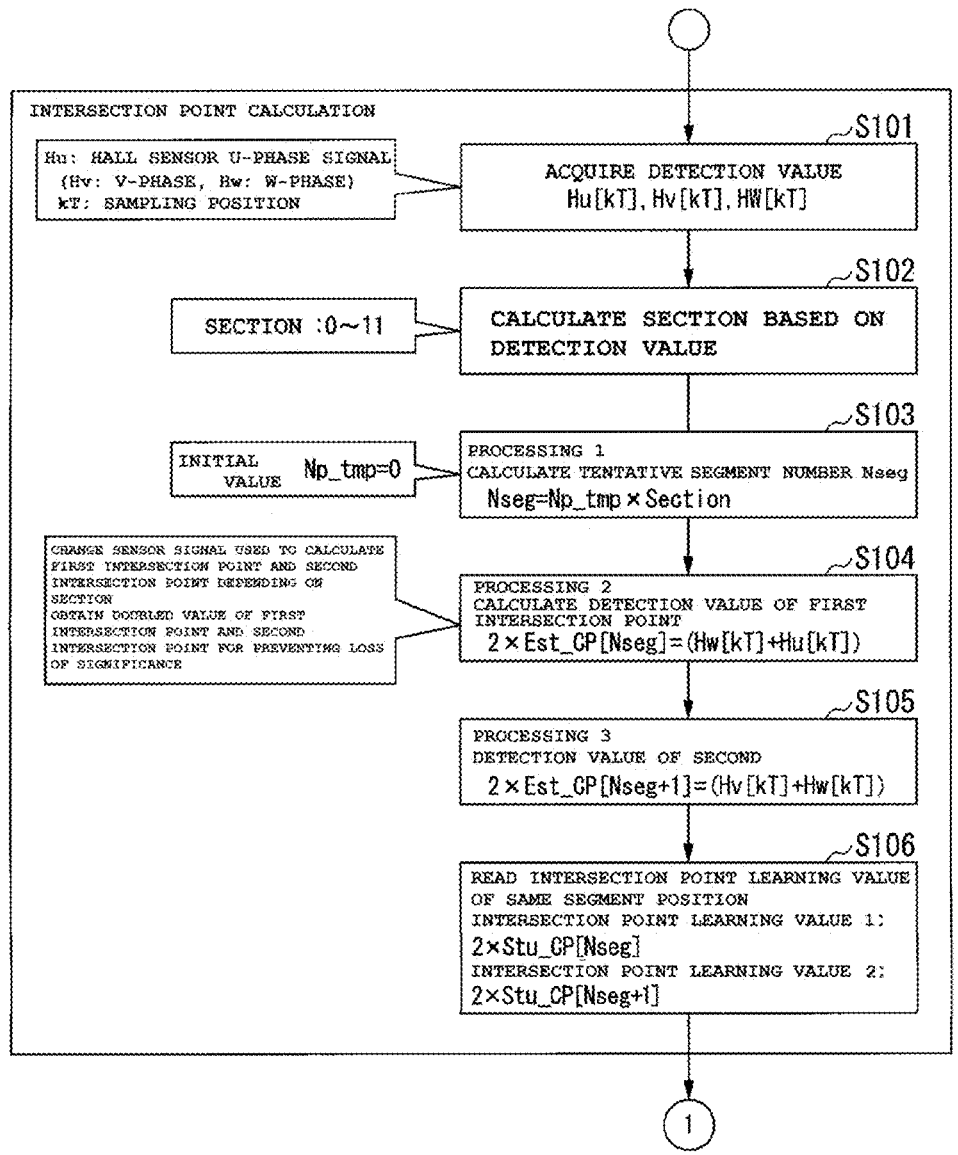
FIG. 6 is a flowchart showing an example of calculation processing of an intersection point in the first example embodiment.

FIG. 6 is a flowchart showing an example of the calculation processing of an intersection point. The position estimation device 4 repeatedly executes the operations shown in the flowcharts of FIGS. 6, 7, and 8 at predetermined cycles, for example. The feature amount calculator 412 acquires, from the corrector 411, the U-phase signal Hu [kT], the V-phase signal Hv [kT], and the W-phase signal Hw [kT] whose waveforms have been corrected, as detection values of each magnetic field strength. The feature amount calculator 412 may acquire, from the switch unit 410, the U-phase signal Hu [kT], the V-phase signal Hv [kT], and the W-phase signal Hw [kT] whose waveforms have not been corrected (Step S101).

The feature amount calculator 412 calculates the section number from the detection value of each magnetic field strength based on the correspondence relationship between the digital value and the section shown in FIG. 3, for example. For example, the feature amount calculator 412 calculates the section number "8" shown in FIG. 3 from the detection values of the sample points 100, 110, and 120 shown in FIG. 5 (Step S102).

Based on the calculated section number "Section", the feature amount calculator 412 calculates a tentative segment number "Nseg" as shown in Expression (1).

$$\text{Nseg}=Np\_tmp\times\text{Section} \quad (1)$$

Here, the initial value of the pole pair number "Np_tmp" is 0. In the motor 2 shown in FIG. 1, the pole pair number is a number from 0 to 3 as shown in FIG. 2 (Step S103).

The feature amount calculator 412 calculates a doubled value of the estimation value "Est_CP [Nseg]" of the feature point 200, as shown in Expression (2), as the feature amount of the waveforms of the U-phase signal Hu [kT] and the W-phase signal Hw [kT]. That is, based on the detection value of the sample point 120 and the detection value of the sample point 110 shown in FIG. 5, the feature amount calculator 412 calculates a doubled value of the estimation value of the feature point 200 as the feature amount of the waveform of the magnetic field strength as shown in Expression (2) (Step S104).

$$2 \times Est\_CP[Nseg] = (Hw[kT] + Hu[kT]) \quad (2)$$

The feature amount calculator 412 calculates a doubled value of the estimation value "Est_CP[Nseg+1]" of the feature point 210, as shown in Expression (3), as the feature amount of the waveforms of the V-phase signal Hv [kT] and the W-phase signal Hw [kT]. That is, based on the detection value of the sample point 120 and the detection value of the sample point 110, the feature amount calculator 412 calculates a doubled value of the estimation value of the feature point 210 as the feature amount of the waveform of the magnetic field strength as shown in Expression (3).

$$2 \times Est\_CP[Nseg+1] = (Hv[kT] + Hw[kT]) \quad (3)$$

The reason why the feature amount calculator 412 calculates the doubled value is to prevent loss of significance (Step S105).

The estimator 413 acquires a doubled value (=2×Stu_CP [Nseg]) of the learning value of the feature point 200 of the tentative segment number "Nseg". The estimator 413 acquires a doubled value (=2×Stu_CP[Nseg+1]) of the learning value of the feature point 210 of the tentative segment number "Nseg+1" (Step S106).

Figure 7:
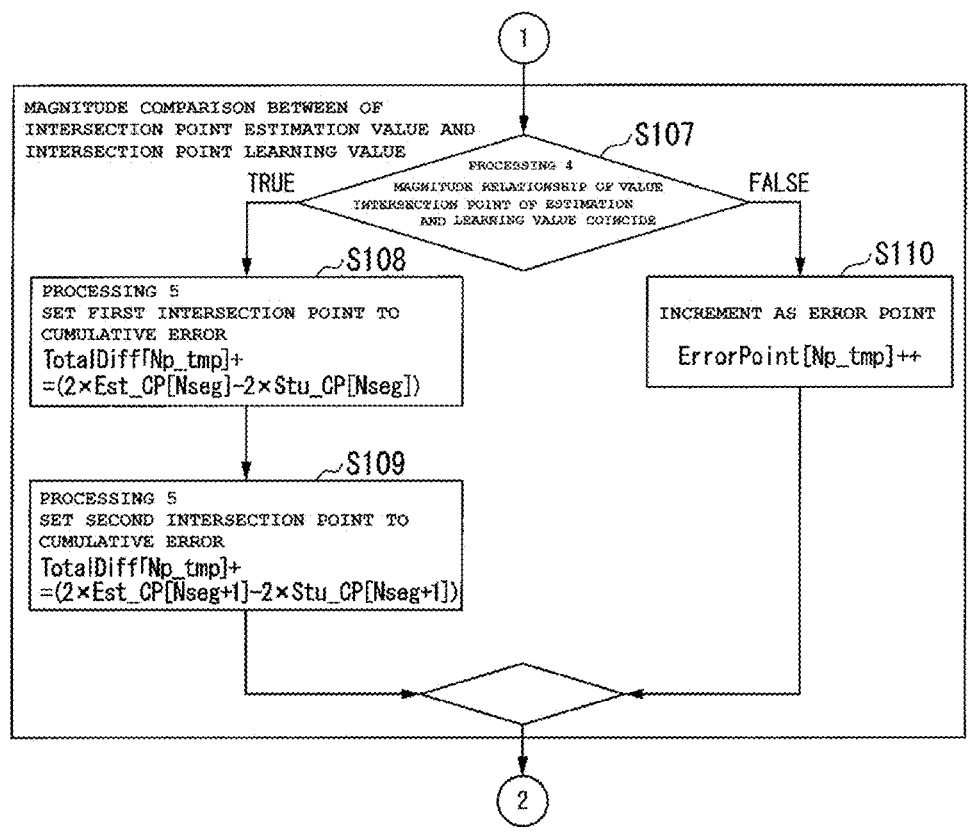
FIG. 7 is a flowchart showing an example of magnitude comparison processing in the first example embodiment.

FIG. 7 is a flowchart showing an example of the magnitude comparison processing. The position estimation device 4 executes the magnitude comparison processing following the calculation processing of the intersection point shown in FIG. 6.

The estimator 413 determines the magnitude relationship between the doubled value of the estimation value of the feature point 200 and the doubled value of the estimation value of the feature point 210. That is, the estimator 413 determines whether or not Expression (4) is established.

$$2 \times Est\_CP[Nseg] < 2 \times Est\_CP[Nseg+1] \quad (4)$$

The estimator 413 determines the magnitude relationship between the doubled value of the learning value of the feature point 200 and the doubled value of the learning value of the feature point 210. That is, the estimator 413 determines whether or not Expression (5) is established.

$$2 \times Stu\_CP[Nseg] < 2 \times Stu\_CP[Nseg+1] \quad (5)$$

The estimator 413 determines whether or not the magnitude relationship of the doubled value of the estimation value of the feature point 200 and the doubled value of the estimation value of the feature point 210 coincides with the magnitude relationship of the doubled value of the learning value of the feature point 200 and the doubled value of the learning value of the feature point 210. For example, in FIGS. 2, 4, and 5, the estimator 413 determines, with respect to the segment numbers "8", "20", "32", and "44" associated with the section number "8" in FIG. 2, whether or not the magnitude relationship of each learning value of the first intersection point and the second intersection point corresponding to the feature points 200 and the feature points 210 in FIG. 4 coincide with the magnitude relationship of each estimation value of the feature point 200 and the feature point 210 in FIG. 5 (Step S107).

If the magnitude relationships coincide (Step S107: TRUE), the estimator 413 adds, as shown in Expression (6), to the variable "TotalDiff[Np_tmp]" of the cumulative error, the error between the doubled value of the estimation value of the feature point 200 and the doubled value of the learning value of the feature point 200 (Step S108).

$$TotalDiff[Np\_tmp] += (2 \times Est\_CP[Nseg] - 2 \times Est\_CP[Nseg]) \quad (6)$$

The estimator 413 adds, as shown in Expression (7), to the variable "TotalDiff[Np_tmp]" of the cumulative error, the error between the doubled value of the estimation value of the feature point 210 and the doubled value of the learning value of the feature point 210 (Step S109).

$$TotalDiff[Np\_tmp] += (2 \times Est\_CP[Nseg+1] - 2 \times Est\_CP[Nseg+1]) \quad (7)$$

If the magnitude relationships do not coincide (Step S107: FALSE), the estimator 413 increments the value of the error point "ErrorPoint[Np_tmp]", which is the evaluation value of the error for each segment Nseg (Step S110).

Figure 8:
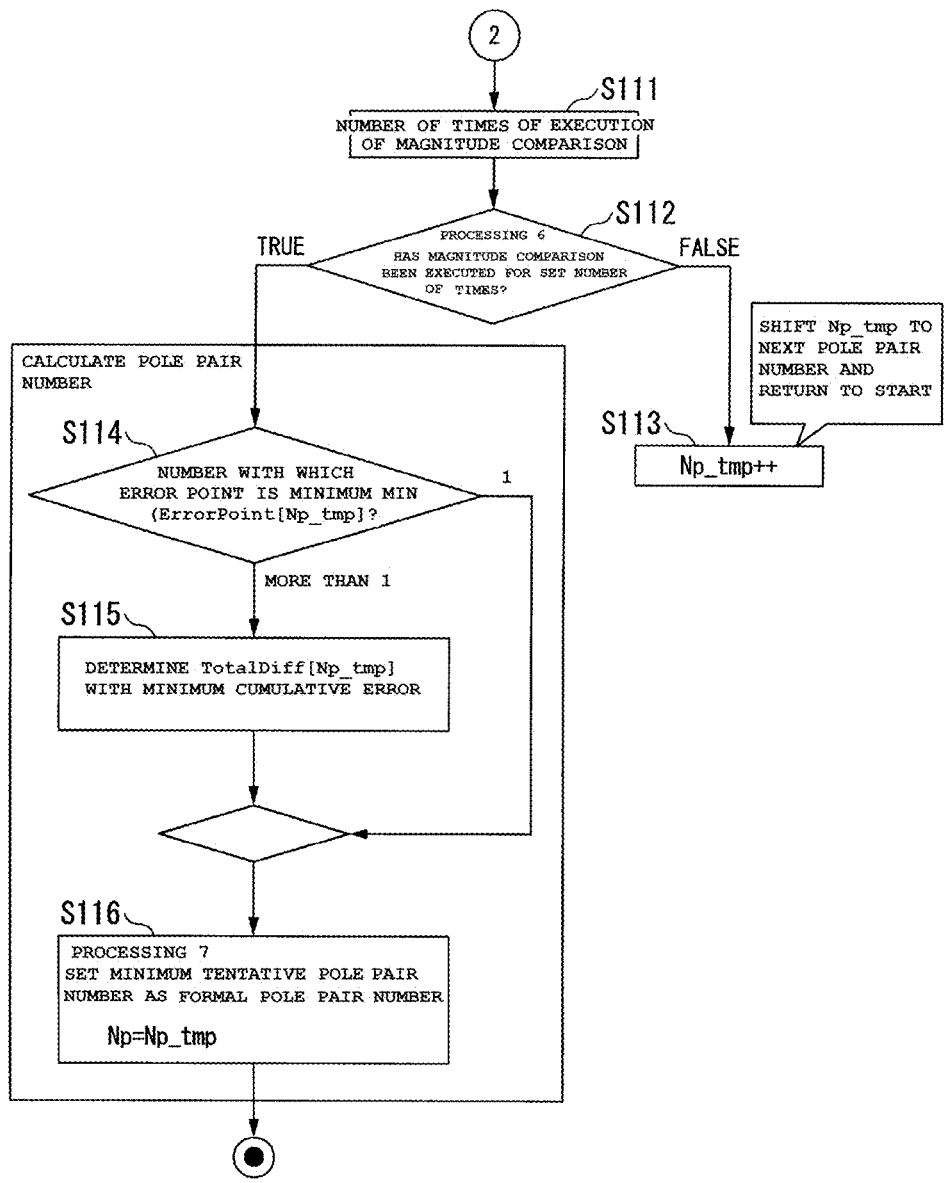
FIG. 8 is a flowchart showing an example of calculation processing of a pole pair number in the first example embodiment.

FIG. 8 is a flowchart showing an example of the calculation processing of a pole pair number. The position estimation device 4 executes the calculation processing of the pole pair number following the magnitude comparison processing shown in FIG. 7.

The estimator 413 increments the value of the variable representing the number of times of execution of the magnitude comparison processing (Step S111). The estimator 413 determines whether or not the value of the variable representing the number of times of execution of the magnitude comparison processing is equal to or greater than the set number of times (Step S112). If the value of the variable representing the number of times of execution is less than the set number of times (Step S112: FALSE), the estimator 413 increments the value of the pole pair number "Np_tmp" (Step S113).

If the value of the variable representing the number of times of execution is equal to or greater than the set number of times (Step S112: TRUE), the estimator 413 determines the number of the smallest error points "Min(ErrorPoint [Np_tmp])" among the plurality of error points (Step S114). If number of the smallest error points is 1 (Step S114: 1), the estimator 413 proceeds the processing to step S116. Thus, the estimator 413 estimates the pole pair number associated with the segment having the same magnitude relationship, as the rotation position of the rotor 21.

If the number of the smallest error points is more than (Step S114: Plural), the estimator 413 acquires the pole pair number "Np_tmp" having the smallest cumulative error (Step S115). The estimator 413 substitutes the pole pair number "Np_tmp" into the variable "Np" representing the correct pole pair number. The estimator 413 outputs the variable "Np" representing the correct pole pair number to the control device 5 as a detection result (absolute value of the mechanical angle) of the rotation position. Thus, the estimator 413 calculates, for each segment, an error between each learning value and each estimation value. The estimator 413 may calculate, for each segment, an error between an absolute value of each learning value and an absolute value of each estimation value. The estimator 413 estimates the pole pair number of the segment in which the error between each learning value and each estimation value is minimum, as the rotation position of the rotor 21 (Step S116).

As described above, the position estimation device 4 of the first example embodiment includes the feature amount calculator 412 and the estimator 413. The feature amount calculator 412 acquires detection values of magnetic field strength at three or more places of the rotor 21 in a range where the rotor angle is less than one rotation. The feature amount calculator 412 selects a section based on the detection value of the magnetic field strength from a plurality of sections predetermined for the pole pair number of the rotor 21. The feature amount calculator 412 calculates a plurality of feature amounts of the waveform of the magnetic field strength based on the combination of the detection values of the magnetic field strength corresponding to the selected section. The estimator 413 determines, for each segment associated with the selected section, whether or not the magnitude relationship of the plurality of feature amounts learned in advance coincides with the magnitude relationship of the plurality of feature amounts calculated. The estimator 413 estimates the pole pair number associated with the segment having the same magnitude relationship, as the rotation position of the rotor 21.

Due to this, the position estimation device 4 of the first example embodiment can estimate the rotation position of the rotor 21 even when the rotor angle is 0 degrees. The control device 5 may not adjust the origin of the rotation position of the rotor 21 when the motor 2 or the control device 5 is turned on. Since the estimator 413 estimates the rotation position of the rotor 21 based on the magnitude relationship between each learning value and each estimation value, it is possible to estimate the rotation position of the rotor 21 even if the output of the sensor 220 changes according to aging deterioration, environmental temperature, and the like.

The Second Example Embodiment

The second example embodiment is different from the first example embodiment in that the position estimation device 4 estimates the rotation position of the rotor 21 in a range where the rotor angle is equal to or less than "half cycle of the electrical angle", for example, in a range where the rotor angle is equal to or less than "⅛ (mechanical angle)" rotation. For the second example embodiment, differences from the first example embodiment will be described.

Figure 9:
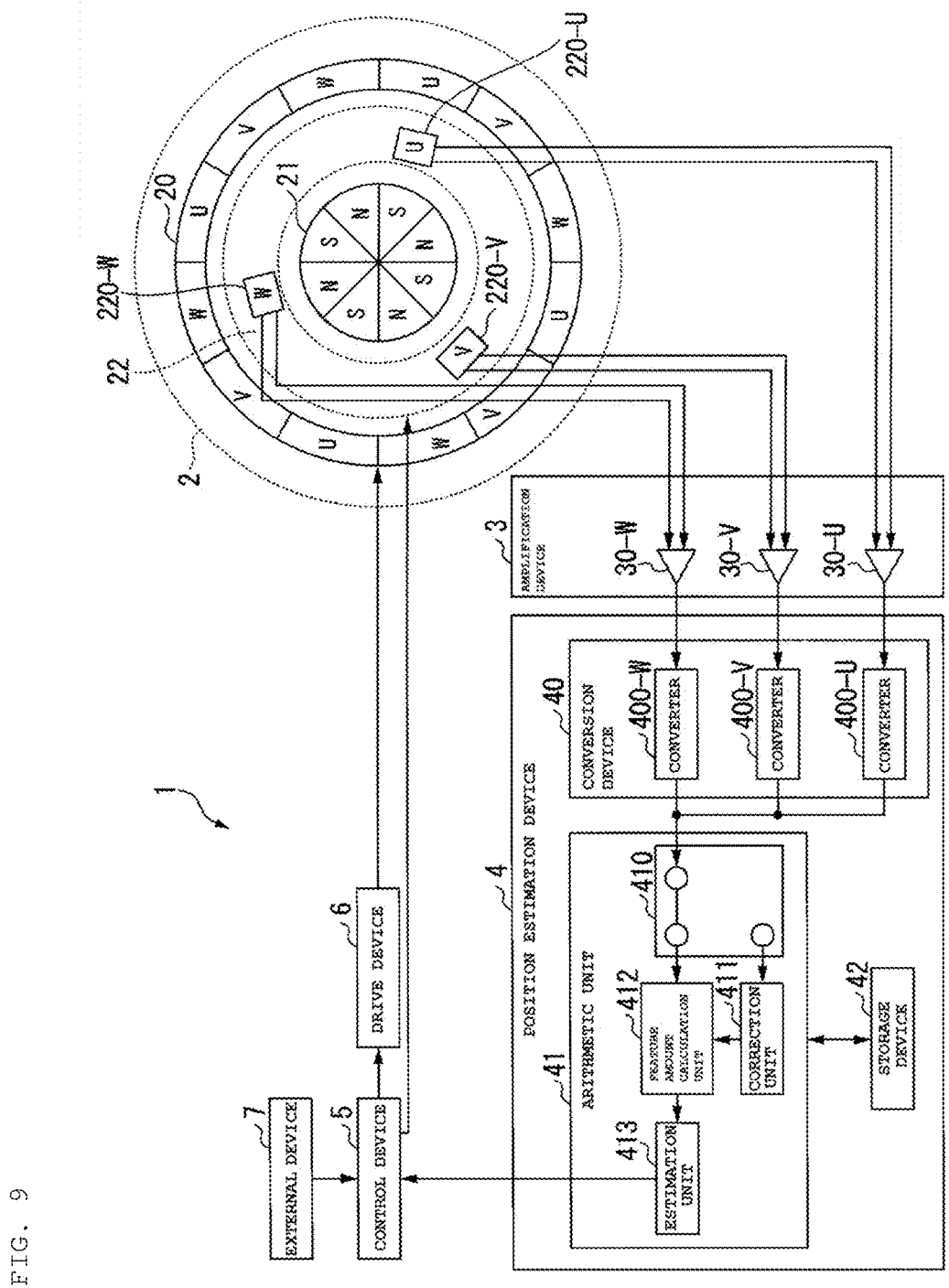
FIG. 9 is a view showing an example of a configuration of a motor assembly in a second example embodiment of the present disclosure.

FIG. 9 is a view showing an example of the configuration of the motor assembly 1. In the second example embodiment, the drive device 6 rotates the rotor 21 in a range where the rotor angle is equal to or less than "⅛ (mechanical angle)" rotation. The switch unit 410 outputs, to the feature amount calculator 412, the U-phase signal Hu, the V-phase signal Hv, and the W-phase signal Hw acquired from the conversion device 40. In the second example embodiment, the correction processing of the waveform of the magnetic field strength by the corrector 411 is not executed. When the motor assembly 1 executes the position estimation based on the waveform to which the correction processing is not applied, the motor assembly 1 can improve the discriminability of the pattern of each feature point of the waveform. Note that the corrector 411 may perform noise reduction processing on the waveform or the like.

Figure 10:
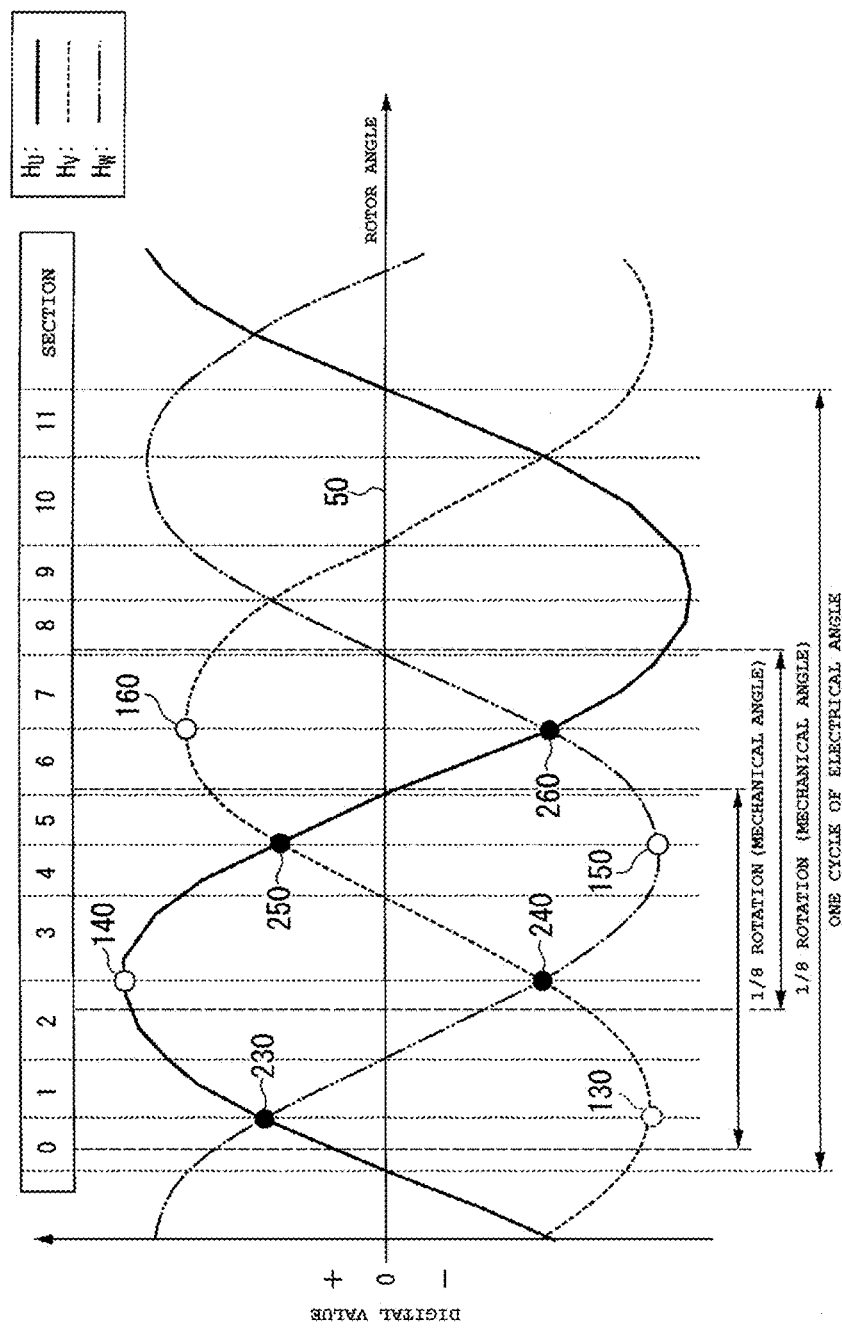
FIG. 10 is a view showing an example of a detection value of a feature point of a waveform in the second example embodiment.

FIG. 10 is a view showing an example of a detection value of a feature point of a waveform. The feature amount calculator 412 acquires detection values of magnetic field strength at three or more places of the rotor 21 from the switch unit 410 according to the rotor angle of the rotor 21. In FIG. 10, the feature amount calculator 412 acquires, from the switch unit 410, the waveform of each magnetic field strength of the U-phase signal Hu, the V-phase signal Hv, and the W-phase signal Hw in the range of ⅛ rotation (mechanical angle). The feature amount calculator 412 calculates a plurality of feature amounts of the waveform of the magnetic field strength based on the detection value of the magnetic field strength. The plurality of feature amounts are, for example, the absolute value of a detection value of each intersection point of the waveform of the magnetic field strength and the absolute value of a detection value of the maximum value or the minimum value of the waveform of the magnetic field strength.

When the positive/negative of at least one of the detection values of the waveform of each magnetic field strength changes, the feature amount calculator 412 calculates the absolute value of the detection value of the maximum value or the minimum value of the waveform of the magnetic field strength. For example, during the period from the middle of the section "0" to the section "1", none of the waveforms of the U-phase signal Hu, the V-phase signal Hv, and the W-phase signal Hw passes through a reference line 50 having a value of 0 (zero cross). In this case, since the position of a feature point 130 in the waveform of the V-phase signal Hv is sometimes not determined, the feature amount calculator 412 does not have to calculate the absolute value of the detection value of the feature point 130.

For example, when the estimator 413 estimates the rotation position of the rotor 21 based on the range of "⅛ rotation (mechanical angle)" from the middle of the section "0" to the section "5", the plurality of feature amounts are the absolute value of the detection value of a feature point 230 which is the first intersection point, the absolute value of the detection value of a feature point 240 which is the second intersection point, the absolute value of the detection value of a feature point 250 which is the third intersection point, the absolute value of the detection value of a feature point 140 which is the maximum value, and the absolute value of the detection value of a feature point 150 which is the minimum value.

For example, when the estimator 413 estimates the rotation position of the rotor 21 based on the range of "⅛ rotation (mechanical angle)" from the middle of the section "2" to the section "7", the plurality of feature amounts are the absolute value of the detection value of the feature point 240 which is the first intersection point, the absolute value of the detection value of the feature point 250 which is the second intersection point, the absolute value of the detection value of a feature point 260 which is the third intersection point, the absolute value of the detection value of a feature point 160 which is the maximum value, and the absolute value of the detection value of the feature point 150 which is the minimum value.

The feature amount calculator 412 may calculate a plurality of feature amounts by multiplying the detection value of the magnetic field strength by a magnification. Due to this, the feature amount calculator 412 can prevent the occurrence of loss of significance in the arithmetic processing of the detection value.

The estimator 413 determines, for each pole pair number of the rotor 21, whether or not the pattern of the magnitude relationship of the plurality of feature amounts (learning value) learned in advance coincides with the pattern of the magnitude relationship of the plurality of feature amounts (detection value) calculated. The estimator 413 estimates the pole pair number with which the pattern of the magnitude relationship coincides as the rotation position of the rotor 21. Since the estimator 413 estimates the rotation position of the rotor 21 based on the magnitude relationship between each learning value and each detection value, it is possible to estimate the rotation position of the rotor 21 even if the output of the sensor 220 changes according to aging deterioration, environmental temperature, and the like. The estimator 413 may estimate the rotation position of the rotor 21 based on the difference between the plurality of feature amounts (learning value) learned in advance and the plurality of feature amounts (detection value) calculated. For example, the estimator 413 may estimate, as the rotation position of the rotor 21, the pole pair number with which the difference between the learning value and the detection value becomes minimum.

FIG. 11 is a view showing an example of the learning value of the maximum value and the minimum value of the waveform. In FIG. 11, the learning value of the maximum value of the waveform, the learning value of the minimum value of the waveform, and the pole pair number are associated with one another. The doubled value of the absolute value of the detection value of the feature point 140 (max) is, for example, "7660". The doubled value of the absolute value of the detection value of the feature point 150 (max) is, for example, "7410". In this case, the pattern of the magnitude relationship between the maximum value and the minimum value is a pattern in which the absolute value of the detection value of the feature point 140 is larger than the absolute value of the detection value of the feature point 150.

The estimator 413 determines, for each pole pair number of the rotor 21, whether or not the pattern of the magnitude relationship of the absolute values of each learning values of the maximum value and the minimum value coincides with the pattern of the magnitude relationship of the absolute values of the detection values of the feature point 140 and the feature point 150.

In FIG. 11, the estimator 413 determines that the pattern of the magnitude relationship of the maximum value and the minimum value associated with the pole pair number "0" coincides with the pattern of the magnitude relationship of the absolute values of the detection values of the feature point 140 and the feature point 150. The same is true for the pole pair number "1". The estimator 413 adds an error between each detection value and each learning value for each pole pair number with which each pattern of the magnitude relationship coincides.

In FIG. 11, the estimator 413 determines that the pattern of the magnitude relationship of the maximum value and the minimum value associated with the pole pair number "2" does not coincide with the pattern of the magnitude relationship of the absolute values of the detection values of the feature point 140 and the feature point 150. The same is true for the pole pair number "3". The estimator 413 adds a value to an error point of a pole pair number with which each pattern of the magnitude relationship does not coincide.

Since the estimator 413 does not add a value to the error point of the pole pair number with which each pattern of the magnitude relationship coincides, the value of the error point of the pole pair number with which each pattern of the magnitude relationship coincides is the minimum value "0".

FIG. 12 is a view showing an example of the learning value of an intersection point of a waveform. In FIG. 12, the learning value of the first intersection point of the waveform, the learning value of the second intersection point of the waveform, the learning value of the third intersection point of the waveform, and the pole pair number are associated with one another. The doubled value of the absolute value of the detection value of the feature point 230 (first intersection point) is, for example, "3888". The doubled value of the absolute value of the detection value of the feature point 240 (second intersection point) is, for example, "3779". The doubled value of the absolute value of the detection value of the feature point 250 (third intersection point) is, for example, "3881". In this case, the pattern of the magnitude relationship of each intersection point is a pattern in which the doubled value of the absolute value of the detection value of the feature point 230 is larger than the doubled value of the absolute value of the detection value of the feature point 240. It is a pattern in which the doubled value of the absolute value of the detection value of the feature point 230 is larger than the doubled value of the absolute value of the detection value of the feature point 250. It is a pattern in which the doubled value of the absolute value of the detection value of the feature point 240 is smaller than the doubled value of the absolute value of the detection value of the feature point 250.

The estimator 413 determines, for each pole pair number of the rotor 21, whether or not the pattern of the magnitude relationship of the absolute values of the learning values of the three intersection points coincides with the pattern of the magnitude relationship of the absolute values of the detection values of the feature point 230, the feature point 240, and the feature point 250.

In FIG. 12, the estimator 413 determines that the pattern of the magnitude relationship of the absolute value of each learning value of the three intersection points associated with the pole pair number coincides with the pattern of the magnitude relationship of the absolute value of each detection value of the feature points 140 and 150. The same is true for the pole pair number "1". The estimator 413 adds an error between each detection value and each learning value for each pole pair number with which each pattern of the magnitude relationship coincides.

In FIG. 12, the estimator 413 determines that the pattern of the magnitude relationship of the absolute value of each learning value of the three intersection points associated with the pole pair number "2" does not coincide with the pattern of the magnitude relationship of the absolute value of each detection value of the feature points 140 and 150. The same is true for the pole pair number "3". The estimator 413 adds a value to an error point of a pole pair number with which each pattern of the magnitude relationship does not coincide.

The estimator 413 acquires, for each pole pair number, a cumulative error between each detection value and each learning value. The estimator 413 substitutes one pole pair number of the minimum cumulative error into one variable representing the correct pole pair number. The estimator 413 may acquire the pole pair number of the smallest error point from among each pole pair number. The estimator 413 may substitute one pole pair number of the smallest error point into one variable representing the correct pole pair number.

Next, an operation example of the position estimation device 4 will be described.

Figure 13:
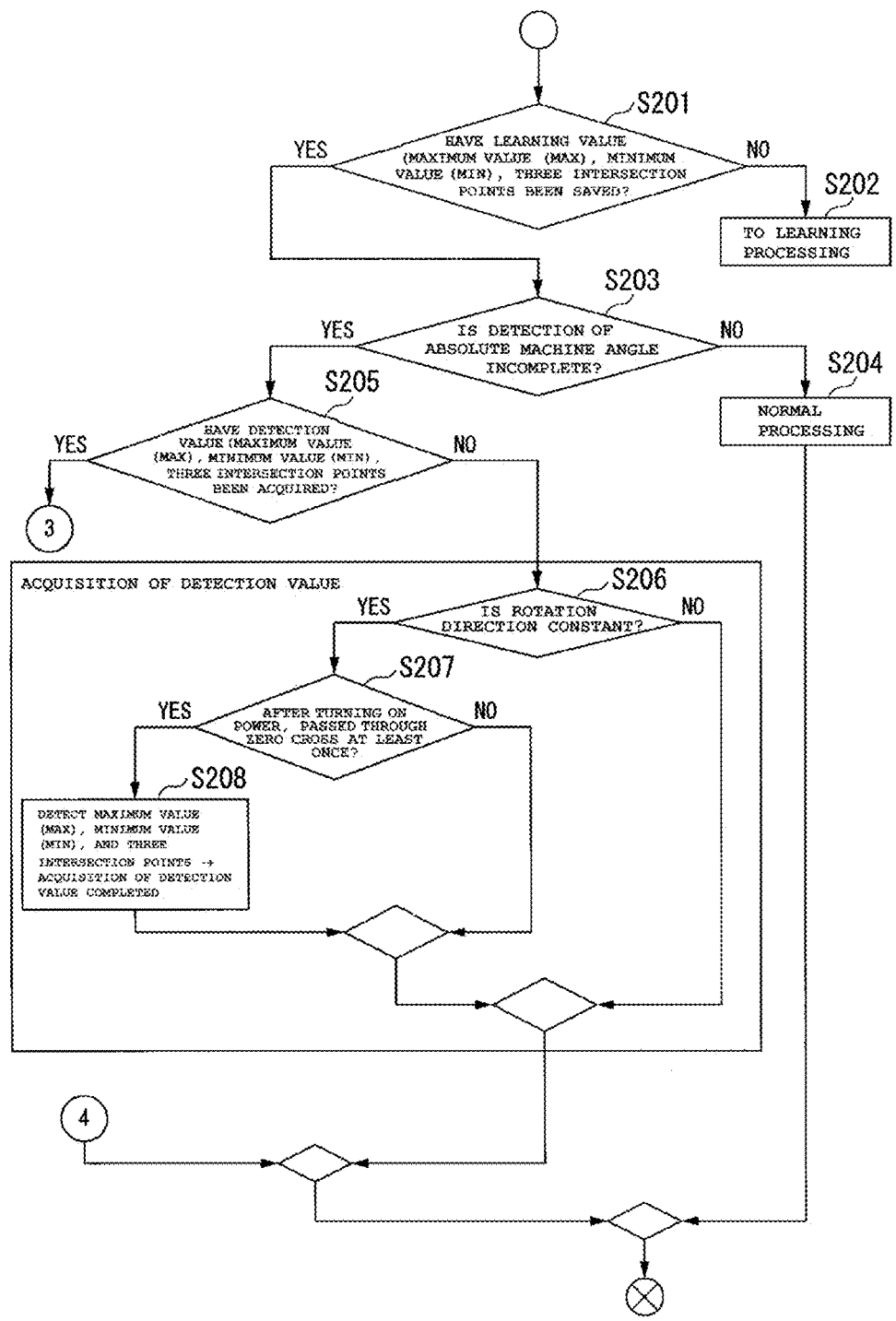
FIG. 13 is a flowchart showing an example of acquisition processing of a detection value in the second example embodiment.

FIG. 13 is a flowchart showing an example of the acquisition processing of a detection value. The position estimation device 4 repeatedly executes the operations shown in the flowcharts of FIGS. 13 and 14 at predetermined cycles, for example. The feature amount calculator 412 determines whether or not each learning value from the first intersection point to the third intersection point of the waveform of the magnetic field strength and each learning value of the maximum value and the minimum value of the waveform of the magnetic field strength are stored in the storage device 42. For example, the feature amount calculator 412 determines whether or not each learning value of the feature point 230, the feature point 240, and the feature point 250, and each learning value of the feature point 140 and the feature point 150 are stored in the storage device 42 (Step S201).

If each learning value is not stored in the storage device 42 (Step S201: NO), the feature amount calculator 412 executes processing of calculating (learning processing) the learning values of the feature points. The feature amount calculator 412 records the calculated learning value of the feature point and the pole pair number into a data table stored in the storage device 42. The feature amount calculator 412 may record the calculated learning value of the feature point and the segment number into the data table (Step S202).

If each learning value is stored in the storage device (Step S201: YES), the feature amount calculator 412 determines whether or not the estimation of the rotation position (absolute value of the mechanical angle) has been completed (Step S203). When the estimation of the rotation position has been completed (Step S203: NO), the position estimation device 4 executes predetermined normal processing (Step S204).

The feature amount calculator 412 executes processing of calculating each detection value from the first intersection point to the third intersection point of the waveform of the magnetic field strength. The feature amount calculator 412 executes processing of calculating each detection value of the maximum value and the minimum value of the waveform of the magnetic field strength. The feature amount calculator 412 determines whether or not acquisition of each detection value has been completed (Step S205).

If the acquisition of each detection value has not been completed (Step S205: NO), the feature amount calculator 412 determines whether or not the rotation direction of the rotor 21 is constant, based on the waveform of the magnetic field strength (Step S206). If the rotation direction of the rotor 21 is not constant (Step S206: NO), the position estimation device 4 ends the processing shown in FIG. 13.

When the rotation direction of the rotor 21 is constant (Step S206: YES), it is determined whether or not any waveform of the U-phase signal Hu, the V-phase signal Hv, or the W-phase signal Hw has passed through the reference line 50 (zero cross) after the power of the position estimation device 4 is turned on.

For example, in the case where the estimator 413 estimates the rotation position of the rotor 21 based on the range of "⅛ rotation (mechanical angle)" from the middle of the section "0" to the section "5" shown in FIG. 10, none of the waveform of the U-phase signal Hu, the V-phase signal Hv, and the W-phase signal Hw has passed through the reference line 50 during the period from the middle of the section "0" to the section "1". That is, during the period from the middle of the section "0" to the section "1", the positive/negative of the digital value has not changed in any waveform of the U-phase signal Hu, the V-phase signal Hv, and the W-phase signal Hw. If the positive/negative of the digital value has not changed, the detection value of the feature point 130 representing the minimum value of the V-phase signal Hv during the period from the middle of the section "0" to the section "1" may not be acquired. This is because since the position of the feature point 130 in the waveform of the V-phase signal Hv is not determined, the feature amount calculator 412 sometimes fails to accurately calculate the detection value of the feature point 130.

For example, in the case where the estimator 413 estimates the rotation position of the rotor 21 based on the range of "⅛ rotation (mechanical angle)" from the middle of the section "2" to the section "7" shown in FIG. 10, the detection value of the feature point 140 representing the maximum value of the waveform of the U-phase signal Hu during the period from the middle of the section "2" to the section "7" may not be acquired for the same reason (Step S207).

If none of the waveforms has passed through the reference line 50 (Step S207: NO), the position estimation device 4 ends the processing shown in FIG. 13.

When any of the waveforms has passed through the reference line 50 in accordance with the rotation of the rotor 21 (Step S207: YES), the feature amount calculator 412 executes processing of calculating each detection value from the first intersection point to the third intersection point of the waveform of the magnetic field strength, and processing of calculating each detection value of the maximum value and the minimum value of the waveform of the magnetic field strength. For example, in the case where the estimator 413 estimates the rotation position of the rotor 21 based on the range of "⅛ rotation (mechanical angle)" from the middle of the section "0" to the section "5" shown in FIG. 10, the feature amount calculator 412 executes processing of calculating each detection value of the feature point 230, the feature point 240, and the feature point 250, and processing of calculating each detection value of the feature point 140 and the feature point 150 (Step S208).

Figure 14:
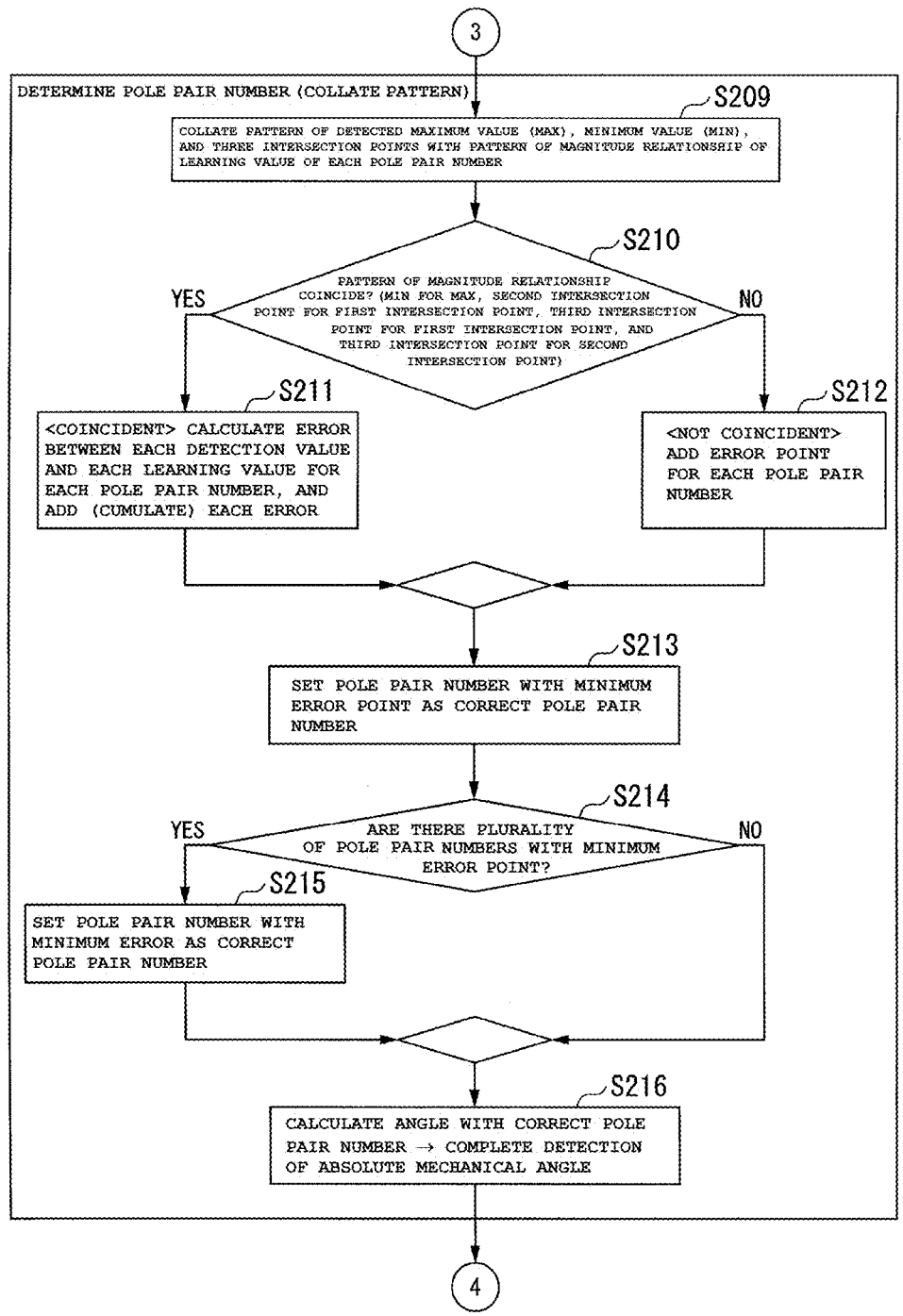
FIG. 14 is a flowchart showing an example of calculation processing of a pole pair number in the second example embodiment.

FIG. 14 is a flowchart showing an example of the calculation processing of the pole pair number. The position estimation device 4 executes the calculation processing of the pole pair number following the acquisition processing of the detection value shown in FIG. 13.

When the acquisition of each detection value is completed in step S205 shown in FIG. 13 (Step S205: YES), the estimator 413 collates the pattern of the magnitude relationship of each detection value from the first intersection point to the third intersection point with the pattern of the magnitude relationship of each learning value from the first intersection point to the third intersection point. The estimator 413 collates the pattern of the magnitude relationship of the absolute value of each detection value of the maximum value and the minimum value with the pattern of the magnitude relationship of the absolute value of each learning value of the maximum value and the minimum value.

For example, in the case where the estimator 413 estimates the rotation position of the rotor 21 based on the range of "⅛ rotation (mechanical angle)" from the middle of the section "0" to the section "5" shown in FIG. 10, the estimator 413 collates the pattern of the magnitude relationship of each detection value of the feature point 230, the feature point 240, and the feature point 250 with the pattern of the magnitude relationship of each learning value of the feature point 230, feature point 240, and feature point 250. The estimator 413 collates the pattern of the magnitude relationship of the absolute value of each detection value of the feature point 140 and the feature point 150 with the pattern of the magnitude relationship of the absolute value of each learning value of the feature point 140 and the feature point 150 (Step S209).

The estimator 413 determines whether or not each pattern of the magnitude relationship coincides. That is, the estimator 413 determines whether or not the magnitude relationship between the absolute value of the detection value of the maximum value and the absolute value of the detection value of the minimum value, the magnitude relationship between the detection value of the first intersection point and the detection value of the second intersection point, the magnitude relationship between the detection value of the first intersection point and the detection value of the third intersection point, and the magnitude relationship between the detection value of the second intersection point and the detection value of the third intersection point all coincide together.

For example, in the case of estimating the rotation position of the rotor 21 based on the range of "⅛ rotation (mechanical angle)" from the middle of the section "0" to the section "5" shown in FIG. 10, the estimator 413 determines whether or not the magnitude relationship between the absolute value of the detection value of the feature point 140 and the absolute value of the detection value of the feature point 150, the magnitude relationship between the detection value of the feature point 230 and the detection value of the feature point 240, the magnitude relationship between the detection value of the feature point 230 and the detection value of the feature point 250, and the magnitude relationship between the detection value of the feature point 240 and the detection value of the feature point 250 all coincide together.

For example, in the case of estimating the rotation position of the rotor 21 based on the range of "⅛ rotation (mechanical angle)" from the middle of the section "2" to the section "7" shown in FIG. 10, the estimator 413 determines whether or not the magnitude relationship between the absolute value of the detection value of the feature point 160 and the absolute value of the detection value of the feature point 150, the magnitude relationship between the detection value of the feature point 240 and the detection value of the feature point 250, the magnitude relationship between the detection value of the feature point 240 and the detection value of the feature point 260, and the magnitude relationship between the detection value of the feature point 260 and the detection value of the feature point 260 all coincide together (Step S210).

If each pattern of the magnitude relationship coincides (Step S210: YES), the estimator 413 adds an error between each detection value and each learning value for each pole pair number with which each pattern of the magnitude relationship coincides. Due to this, the estimator 413 acquires, for each pole pair number, a cumulative error between each detection value and each learning value (Step S211). If each pattern of the magnitude relationship does not coincide (Step S210: NO), the estimator 413 adds a value to an error point of a pole pair number with which each pattern of the magnitude relationship does not coincide (Step S212).

The estimator 413 acquires the pole pair number of the smallest error point from among the pole pair numbers. The estimator 413 substitutes the one or more acquired pole pair numbers into one or more variables representing the correct pole pair number (Step S213). The estimator 413 determines whether or not the number of pole pair numbers of the smallest error point is more than 1 (Step S214). If the number of the pole pair numbers of the minimum error point is 1 (Step S214: NO), the estimator 413 proceeds the processing to step S216. If the number of the pole pair numbers of the minimum error point is more than 1 (Step S214: YES), the estimator 413 substitutes one pole pair number of the minimum cumulative error into one variable representing the correct pole pair number (Step S215). The estimator 413 outputs one variable representing the correct pole pair number to the control device 5 as a detection result (absolute value of the mechanical angle) of the rotation position (Step S216).

As described above, the position estimation device 4 of the second example embodiment includes the feature amount calculator 412 and the estimator 413. The feature amount calculator 412 acquires, according to the rotor angle, detection values of magnetic field strength at three or more places of the rotor 21 in a range where the rotor angle is less than one rotation. The feature amount calculator 412 calculates a plurality of feature amounts of the waveform of the magnetic field strength based on the detection value of the magnetic field strength. The estimator 413 determines, for each pole pair number of the rotor 21, whether or not the pattern of the magnitude relationship of the plurality of feature amounts learned in advance coincides with the pattern of the magnitude relationship of the plurality of feature amounts calculated. The estimator 413 estimates the pole pair number with which the pattern of the magnitude relationship coincides as the rotation position of the rotor 21.

Due to this, the position estimation device 4 of the second example embodiment can estimate the rotation position of the rotor 21 even if the rotor angle is equal to or less than "⅛ (mechanical angle)" rotation. In the case where the estimator 413 estimates the rotation position of the rotor 21 based on the detection values of the total of three feature points, i.e., two intersection points and the feature point of the maximum value or minimum value, the feature amount calculator 412 can calculate three feature amounts, which is smaller for five feature amounts, and hence the estimator 413 can estimate the rotation position of the rotor 21 even if the rotor angle is equal to or smaller than "1/16 (mechanical angle)" rotation.

After executing the position estimation method shown in the first example embodiment, the position estimation device 4 of the second example embodiment may execute the position estimation method shown in the second example embodiment by succeeding the parameter value of the position estimation result of the position estimation result. After executing the position estimation method shown in the second example embodiment, the position estimation device 4 of the second example embodiment may execute the position estimation method shown in Patent Literature 1 by succeeding the parameter value of the position estimation result of the position estimation result.

The Third Example Embodiment

The third example embodiment is different from the second example embodiment in that the position estimation device 4 estimates the rotation position of the rotor 21 based on a larger number of feature points. For the third example embodiment, differences from the second example embodiment will be described.

Figure 15:
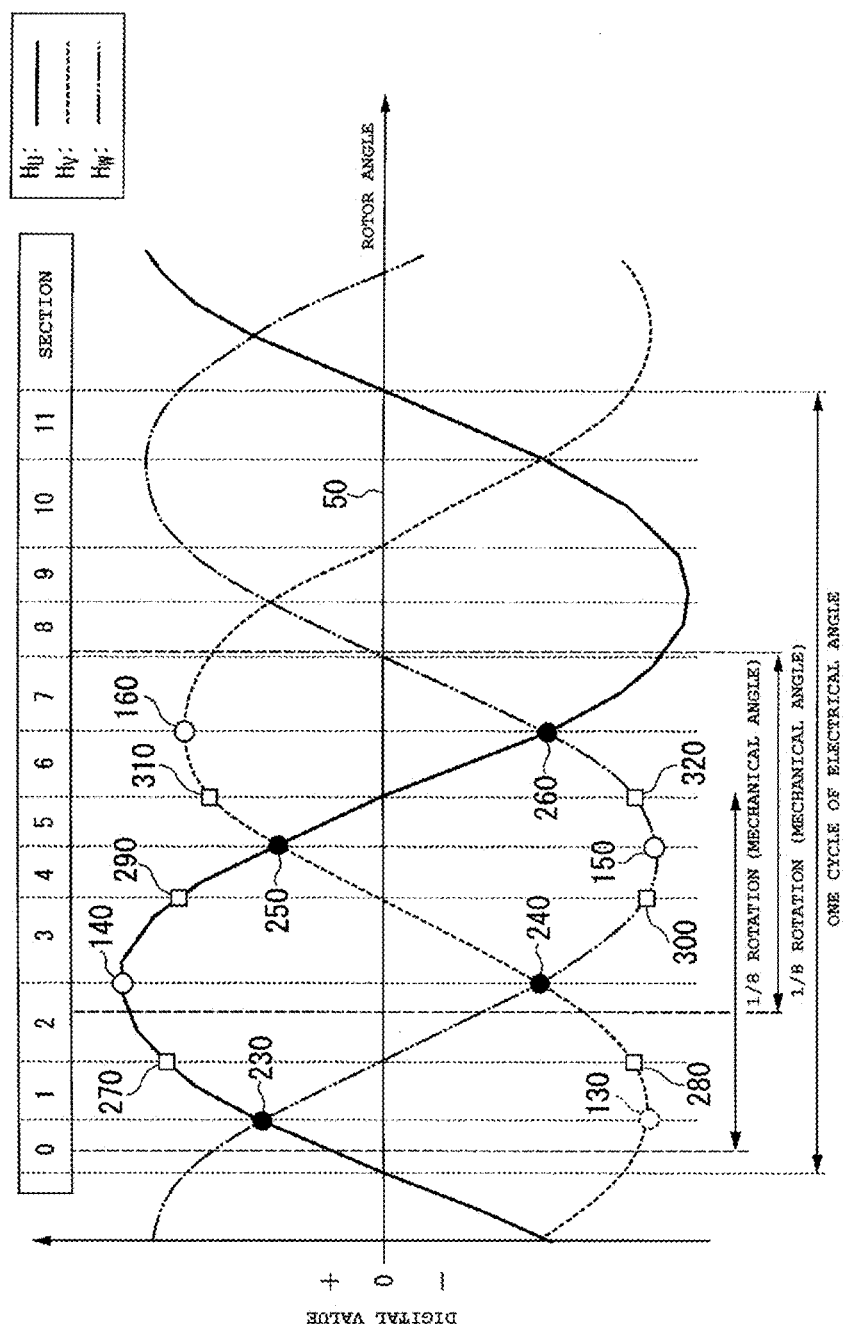
FIG. 15 is a view showing an example of a detection value of a feature point of a waveform in a third example embodiment of the present disclosure.

FIG. 15 is a view showing an example of the detection value of a feature point of a waveform. The feature amount calculator 412 acquires detection values of magnetic field strength at three or more places of the rotor 21 from the switch unit 410 according to the rotor angle of the rotor 21. In FIG. 15, the feature amount calculator 412 acquires, from the switch unit 410, the waveform of each magnetic field strength of the U-phase signal Hu, the V-phase signal Hv, and the W-phase signal Hw in the range of ⅛ rotation (mechanical angle).

The feature amount calculator 412 calculates a plurality of feature amounts of the waveform of the magnetic field strength based on the detection value of the magnetic field strength. The plurality of feature amounts are, for example, the absolute value of a detection value of each intersection point of the waveform of the magnetic field strength and the absolute value of a detection value of the maximum value or the minimum value of the waveform of the magnetic field strength, and the absolute value of a detection value of each other waveform when the waveform of the magnetic field strength passes through the reference line 50.

When any of the waveform of the U-phase signal Hu, the V-phase signal Hv, and the W-phase signal Hw passes through the reference line 50, the feature amount calculator 412 calculates the absolute value of the detection value of each of the other waveforms. In FIG. 15, when the waveform of the W-phase signal Hw passes through the reference line 50, the feature amount calculator 412 calculates the absolute value of the detection value of a feature point 270 of the U-phase signal Hu and the absolute value of the detection value of a feature point 280 of the V-phase signal Hv. When the waveform of the V-phase signal Hv passes through the reference line 50, the feature amount calculator 412 calculates the absolute value of the detection value of a feature point 290 of the U-phase signal Hu and the absolute value of the detection value of a feature point 300 of the W-phase signal Hw. When the waveform of the U-phase signal Hu passes through the reference line 50, the feature amount calculator 412 calculates the absolute value of the detection value of a feature point 310 of the V-phase signal Hv and the absolute value of the detection value of a feature point 320 of the W-phase signal Hw.

For example, when the estimator 413 estimates the rotation position of the rotor 21 based on the range of "⅛ rotation (mechanical angle)" from the middle of the section "0" to the section "5", the plurality of feature amounts are the absolute value of the detection value of a feature point 230 which is the first intersection point, the absolute value of the detection value of a feature point 240 which is the second intersection point, the absolute value of the detection value of a feature point 250 which is the third intersection point, the absolute value of the detection value of a feature point 140 which is the maximum value, the absolute value of the detection value of a feature point 150 which is the minimum value, and the absolute value of each detection value of the feature point 270, the feature point 280, the feature point 290, and the feature point 300.

For example, when the estimator 413 estimates the rotation position of the rotor 21 based on the range of "⅛ rotation (mechanical angle)" from the middle of the section "2" to the section "7", the plurality of feature amounts are the absolute value of the detection value of the feature point 240 which is the first intersection point, the absolute value of the detection value of the feature point 250 which is the second intersection point, the absolute value of the detection value of a feature point 260 which is the third intersection point, the absolute value of the detection value of a feature point 160 which is the maximum value, the absolute value of the detection value of the feature point 150 which is the minimum value, and the absolute value of each detection value of the feature point 290, the feature point 300, the feature point 310, and the feature point 320.

The estimator 413 determines, for each pole pair number of the rotor 21, whether or not the pattern of the magnitude relationship of the absolute values of each learning values of the maximum value and the minimum value coincides with the pattern of the magnitude relationship of the absolute values of the detection values of the feature point 140 and the feature point 150.

The estimator 413 determines, for each pole pair number of the rotor 21, whether or not the pattern of the magnitude relationship of the absolute values of the learning values of the three intersection points coincides with the pattern of the magnitude relationship of the absolute values of the detection values of the feature point 230, the feature point 240, and the feature point 250.

The estimator 413 determines, for each pole pair number of the rotor 21, whether or not the pattern of the magnitude relationship of the absolute values of the learning values of the reference line 50 and the four feature points corresponding to each waveform coincides with the pattern of the magnitude relationship of the absolute values of the detection values of the feature point 270, the feature point 280, the feature points 290, and the feature points 300.

The estimator 413 acquires, for each pole pair number, a cumulative error between each detection value and each learning value. The estimator 413 substitutes one pole pair number of the minimum cumulative error into one variable representing the correct pole pair number. The estimator 413 may acquire the pole pair number of the smallest error point from among each pole pair number. The estimator 413 may substitute one pole pair number of the smallest error point into one variable representing the correct pole pair number.

As described above, the position estimation device 4 of the third example embodiment includes the estimator 413. The estimator 413 determines, for each pole pair number of the rotor 21, whether or not the pattern of the magnitude relationship of the absolute values of the learning values of the reference line and the four or more feature points corresponding to each waveform coincides with the pattern of the magnitude relationship of the absolute values of the detection values of the four or more feature points. The estimator 413 estimates the pole pair number with which the pattern of the magnitude relationship coincides as the rotation position of the rotor 21.

Due to this, the position estimation device 4 of the third example embodiment can further improve the accuracy of estimating the rotation position of the rotor 21 even if the rotor angle is equal to or less than "⅛ (mechanical angle)".

After executing the position estimation method shown in the first example embodiment, the position estimation device 4 of the third example embodiment may execute the position estimation method shown in the third example embodiment by succeeding the parameter value of the position estimation result. After executing the position estimation method shown in the third example embodiment, the position estimation device 4 of the third example embodiment may execute the position estimation method shown in Patent Literature 1 by succeeding the parameter value of the position estimation result.

The example embodiments of this disclosure have been described in detail with reference to the drawings, but the specific configuration is not limited to the example embodiments, and the design and the like within a scope not departing from the gist of this disclosure are also included.

In the design of the motor 2, the accuracy of the mounting positions of the sensor 220-U, the sensor 220-V, and the sensor 220-W may be designed to vary intentionally. Due to this, the amplitudes and the like of each waveform of the U-phase signal Hu, the V-phase signal Hv, and the W-phase signal Hw have different values from each other, thereby improving the discriminability of the waveform. Due to the improvement of discriminability of the waveform, the position estimation device 4 can further improve the accuracy of estimating the rotation position of the rotor 21 of the mass-produced motor 2.

Note that the procedure of each processing may be performed by recording a program for implementing the function of the position estimation device in the present disclosure on a computer-readable recording medium not illustrated, and reading, to computer system, the program recorded on the recording medium to execute the program. The "computer system" mentioned here shall include hardware such as an OS and peripheral devices. The "computer system" also includes a WWW system provided with a website provision environment (or display environment). The "computer-readable recording medium" refers to portable media such as a flexible disk, a magneto-optical disk, a ROM, and a CD-ROM, and storage devices such as a hard disk incorporated into a computer system. Furthermore, the "computer-readable recording medium" shall include those hold the program for a certain period of time such as a volatile memory (RAM) in a computer system serving as a server or a client when a program is transmitted via a network such as the Internet or a communication line such as a telephone line.

The program described above may be transmitted from a computer system in which this program is stored in a storage device or the like to another computer system via a transmission medium or by a transmission wave in the transmission medium. Here, the "transmission medium" transmitting a program refers to a medium having a function of transmitting information such as a network (communication network) such as the Internet or a communication line such as a telephone line. The program described above may be for implementing a part of the function described above. Furthermore, the program may be a so-called difference file (differential program), which can implement the above-described function in combination with a program already recorded in the computer system.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A position estimation device, comprising:
   a feature amount calculator to (i) acquire detection values of a magnetic field strength at three or more locations of a rotor in a range where a rotor angle is less than one rotation, (ii) select a section based on a detection value of the magnetic field strength from a plurality of sections predetermined for a pole pair number of the rotor, and (iii) calculate a plurality of feature amounts of a waveform of the magnetic field strength based on a combination of detection values of the magnetic field strength associated with the selection selected; and
   an estimator to (i) determine, for each segment associated with the section selected, whether or not a magnitude relationship of the plurality of feature amounts learned in advance coincides with a magnitude relationship of the plurality of feature amounts calculated, and (ii) estimate, as a rotation position of the rotor, the pole pair number associated with the segment having a same magnitude relationship.

2. The position estimation device according to claim 1, wherein the plurality of feature amounts are estimation values of each intersection point of a waveform of the magnetic field strength.

3. The position estimation device according to claim 1, further comprising:
   a corrector to correct a waveform of the magnetic field strength; wherein
   the feature amount calculator is configured or programmed to calculate the plurality of feature amounts of a waveform of the magnetic field strength corrected.

4. The position estimation device according to claim 1, wherein the estimator is configured or programmed to estimate, as a rotation position of the rotor, the pole pair number associated with the segment with which a difference between the plurality of feature amounts learned in advance and the plurality of feature amounts calculated becomes minimum.

5. The position estimation device according to claim 1, wherein the feature amount calculator is configured or programmed to calculate the plurality of feature amounts by multiplying a detection value of the magnetic field strength by a magnification.

6. A position estimation method executed by a position estimation device, the method comprising:
   acquiring detection values of a magnetic field strength at three or more locations of a rotor in a range where a rotor angle is less than one rotation, selecting a section based on a detection value of the magnetic field strength from a plurality of sections predetermined for a pole pair number of the rotor, and calculating a plurality of feature amounts of a waveform of the magnetic field strength based on a combination of detection values of the magnetic field strength associated with the selection selected; and
   determining, for each segment associated with the section selected, whether or not a magnitude relationship of the plurality of feature amounts learned in advance coincides with a magnitude relationship of the plurality of feature amounts calculated, and estimating, as a rotation position of the rotor, the pole pair number associated with the segment having a same magnitude relationship.

* * * * *